(12) United States Patent
McClellan (10) Patent No.: US 6,285,302 B1
(45) Date of Patent: Sep. 4, 2001

(54) RUNLENGTH-LIMITED CODE AND METHOD

(75) Inventor: Brett A. McClellan, Laguna Hills, CA (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/464,654

(22) Filed: Dec. 15, 1999

Related U.S. Application Data (60) Provisional application No. 60/113,888, filed on Dec. 28, 1998.

(51) Int. Cl.$^7$ ..................................................... H03M 7/00
(52) U.S. Cl. ................................................. 341/59; 341/94
(58) Field of Search .................................. 341/59, 58, 94, 341/95, 81, 60, 61

(56) References Cited

U.S. PATENT DOCUMENTS

| | | | | |
|---|---|---|---|---|
| 5,757,294 | * | 5/1998 | Fisher et al. ............................ | 341/59 |
| 6,018,304 | * | 1/2000 | Bessios ................................... | 341/58 |
| 6,201,485 | * | 3/2001 | McEwen et al. ....................... | 341/59 |

\* cited by examiner

*Primary Examiner*—Patrick Wamsley
(74) *Attorney, Agent, or Firm*—Carlton H. Hoel; W. James Brady; Frederick J. Telecky, Jr.

(57) ABSTRACT

A method to create runlength-limited codes from shorter codes having suppression of error propagation by insertion of uncoded bits adjacent error suppression end bits of the shorter code.

2 Claims, 7 Drawing Sheets

LOGIC EQUATIONS OF 16/17(0,6/8) DECODER $B = A15 + A14 + A13 + A12 \quad D = A3 + A2 + A1 + A0 \quad T = A8 * A7(A3 + A1)$ $U = B * \overline{A7} \quad V = \overline{A8} * A7$ $E = \overline{A8} * U * D \quad F = \overline{A9} * A8 * U * D \quad G = A9 * A8 * U * D \quad H = U * \overline{D}$ $I = \overline{B} * \overline{A7}(A2 + A0) \quad J = \overline{B} * \overline{A7}(\overline{A2 + A0})$ $K = (A9 + A6) V * D \quad L = (\overline{A9 + A6}) * V * D \quad M = V * \overline{D}$ $N = (A14 + A12)T \quad P = (\overline{A14 + A12})(A11 + A9)T \quad Q = (\overline{A14 + A12})(\overline{A11 + A9})T$ $R = A8 * A7 * (\overline{A3 + A1}) * B \quad S = A8 * A7 (\overline{A3 + A1}) * \overline{B}$ $W = E + F + G + I + K + L + T \quad Z = U + V + N + R$ $C16 = (U + V + T + R)A15 + (I + J)A8 + S$
$C15 = Z * A14 + Q * A13 + P * A11 + (I + J)A10 + S$
$C14 = (U + N + P + R)A13 + J * A9 + I + V + Q + S$
$C13 = Z * A12 + (I + P + S)A9 + J + Q$
$C12 = (Z + I + J + S)A11 + (P + Q)A10$
$C11 = (Z + S)A10 + (I + J + P + Q)A6$
$C10 = K * A13 + (E + N + R)A9 + F * A6 + G + H + J + P + S$
$C9 = (H + K)A9 + E + F + M + R + S$
$C8 = E + F + G + L + N + R$
$C7 = M * A13 + K * A6 + E + G + H + I + L$
$C6 = L * A13 + (E + G + N) * A6 + F + K + P + Q$
$C5 = M * A9 + H * A8 + (W + J + R + S)A5$
$C4 = (W + H + J + R + S)A4 + M$
$C3 = (H + M + R + S)A6 + W * A3 + J$
$C2 = J * A3 + W * A2 + H + M + R + S$
$C1 = (H + M)A5 + (R + S)A2 + (W + J)A1$
$C0 = M * A4 + (W + R + S)A0 + H + J$

*FIG. 4a*

LOGIC EQUATION OF 16/17(0,6/8) DECODER $E = C9 * C8 * C7$  $F = C9 * C8 * \overline{C7} * C6$  $G = C10 * \overline{C9} * C8 * C7$
$H = C10 * \overline{C8} * C7 * \overline{C6}$  $I = \overline{C10} * \overline{C9} * C8 * C7 * C6$  $J = C10 * \overline{C9} * \overline{C8} * \overline{C7} * \overline{C6}$
$K = (C9 + C7)\overline{C8} * C6$  $L = \overline{C10} * \overline{C9} * C8 * C7$  $M = \overline{C10} * C9 * \overline{C8} * \overline{C6}$
$N = \overline{C9} * C8 * \overline{C7}$  $P = C10 * \overline{C9} * \overline{C8} * \overline{C7} * C6$  $Q = \overline{C10} * C9 * \overline{C8} * \overline{C7} * C6$
$R = C9 * C8 * \overline{C7} * \overline{C6}$  $S = C10 * C9 * \overline{C8} * \overline{C7} * \overline{C6}$
$U = E + F + G + H + R$  $V = K + L + M$  $T = N + P + Q$
$W = E + F + G + I + K + L + T$  $Z = U + V + N$ $A15 = (U + V + T)C16$
$A14 = Z * C15$
$A13 = (U + N + P)C14 + Q * C15 + K * C10 + M * C7 + L * C6$
$A12 = Z * C13$
$A11 = (Z + S + I + J)C12 + P * C15$
$A10 = (Z + R + S)C11 + (I + J)C15 + (Q + P)C12$
$A9 = J * C14 + (I + P + S)C13 + (E + N + R)C10 + (H + K)C9 + M * C5 + G$
$A8 = (I + J)C16 + H * C5 + F + G + T + R + S$
$A7 = V + T + R + S$
$A6 = (I + J + P + Q)C11 + F * C10 + K * C7 + (E + G + N)C6 + (H + M + R + S)C3$
$A5 = (W + J + R + S)C5 + (H + M)C1$
$A4 = (W + H + J + R + S)C4 + M * C0$
$A3 = W * C3 + J * C2$
$A2 = W * C2 + (R + S)C1$
$A1 = (W + J)C1$
$A0 = (W + R + S)C0$

RUNLENGTH-LIMITED CODE AND METHOD

RELATED APPLICATIONS

The following patent applications disclose related subject matter: Ser. Nos. 09/009,664 filed Jan. 20, 1998 (T26478), These applications have a common assignee with the present application. This application claim benefit to provisional application 60/118,888 filed Dec. 28, 1998.

BACKGROUND OF THE INVENTION

The invention relates to electronic devices, and, more particularly, to channel modulation codes and methods.

Figure 1:
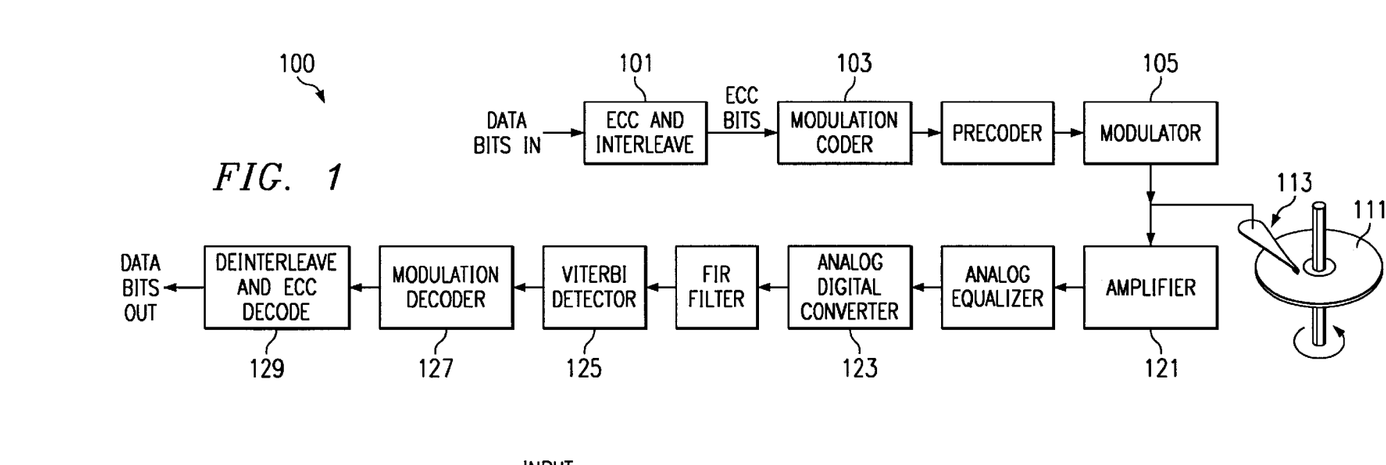
FIG. 1 schematically illustrates a magnetic data storage system.

Magnetic recording systems for digital data storage may have a functional structure as illustrated in FIG. 1. Briefly, for a write of data to storage, data bits typically first receive error correction encoding (such as Reed-Solomon); this coding aims to correct errors generated in the write-read process and which escape correction by the detection method of the read process. Further, interleaving blocks of error correction encoded bits helps correct bursts of errors by spreading the errors over many blocks. Next, the error correction encoded bits are modulation (channel) coded (such as runlength-limited coding); the modulation coding helps read timing recovery. A further preceding may be included. Then the modulation coded bits modulate the polarity of the write current in a read/write head over the magnetic media (e.g., a spinning disk) to set the magnetization directions of domains in the magnetic media. The pattern of magnetization directions is the stored data.

The read process begins with sensing the domain magnetization directions by voltages induced in the read/write head. After amplification the sensed voltages drive clocked analog-to-digital converters to yield a stream of digital samples. Noise in the read sensing, amplification, and conversion generates errors in the stream of digital samples. A detector (such as a peak detector or a Viterbi maximum likelihood detector) recovers the modulation encoded bits from the stream of digital samples. The modulation decoder then converts the coded bits to the error corrected bits, and lastly, the deinterleaver and error correction decoder corrects errors and recovers the data bits.

In more detail, for systems using peak detection of the digital samples, the times between sampled pulses is used to reconstruct the timing information of the stored data. In particular, the output of a peak detector controls a phase-locked loop of a controlled oscillator which provides the output clock. Absolute time cannot be used due to the variations in the speed of the magnetic media over time.

Runlength-limited encoding improves the phase-locked loop accuracy by limiting the time duration between pulses. Runlength-limited coding bounds the time duration between read signal pulse transitions, so the phase-locked loop cannot drift too far from the correct phase or frequency. That is, runlength-limited codes have constraints on the runs of 0's and 1's. A (d,k) constraint with d and k nonnegative integers means a minimum of d 0's between successive 1's and a maximum of k 0's between successive 1's. The d constraint prevents crowding of 1's and deters intersymbol interference in peak detection systems. The k constraint insures sufficiently frequent transitions to keep the phase-locked loop accurate. The k constraint also helps automatic gain control for the amplified sensed currents or voltages used with partial response detection.

In contrast to peak detection, partial response signaling allows for a controlled amount of intersymbol interference; that is, each sample has a value representing contributions from more than one pulse induced in the read/write head. Hence, a partial response system views intersymbol interference as inherent and the d constraint typically may be taken equal to 0. The k constraint still provides the phase-lock loop accuracy in partial response signaling.

Figure 2A:
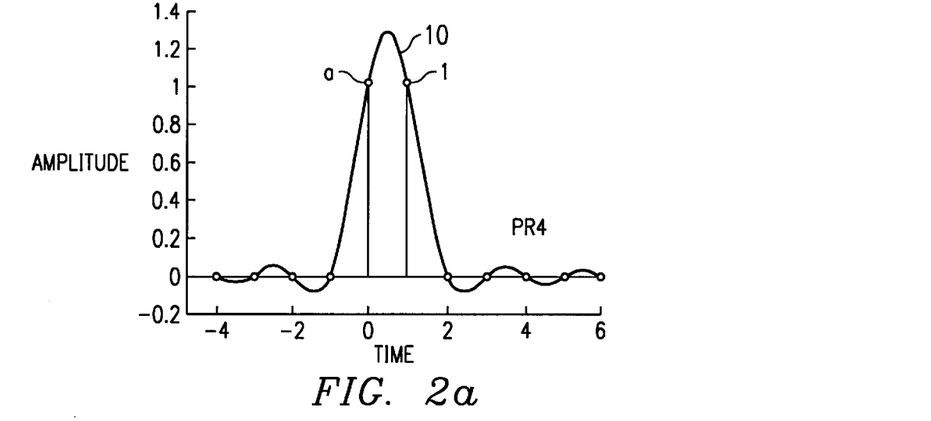
FIGS. 2a–2c shows partial response class IV pulses.
Figure 2B:
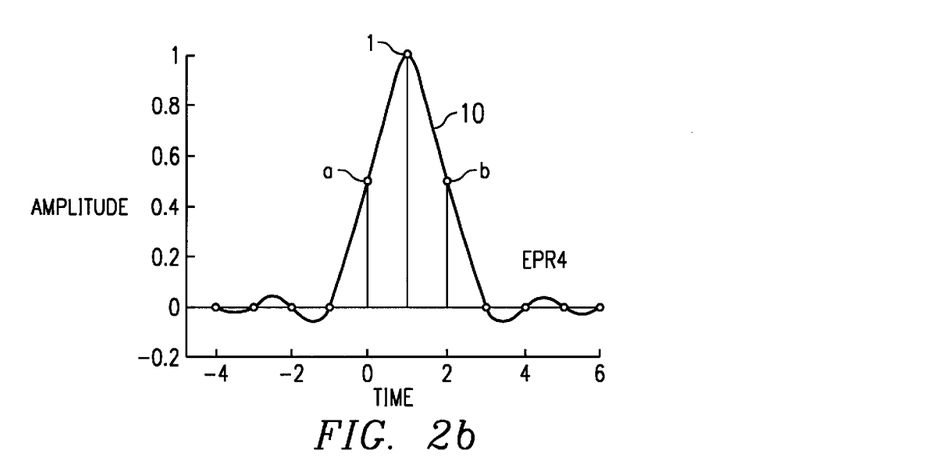
Figure 2C:
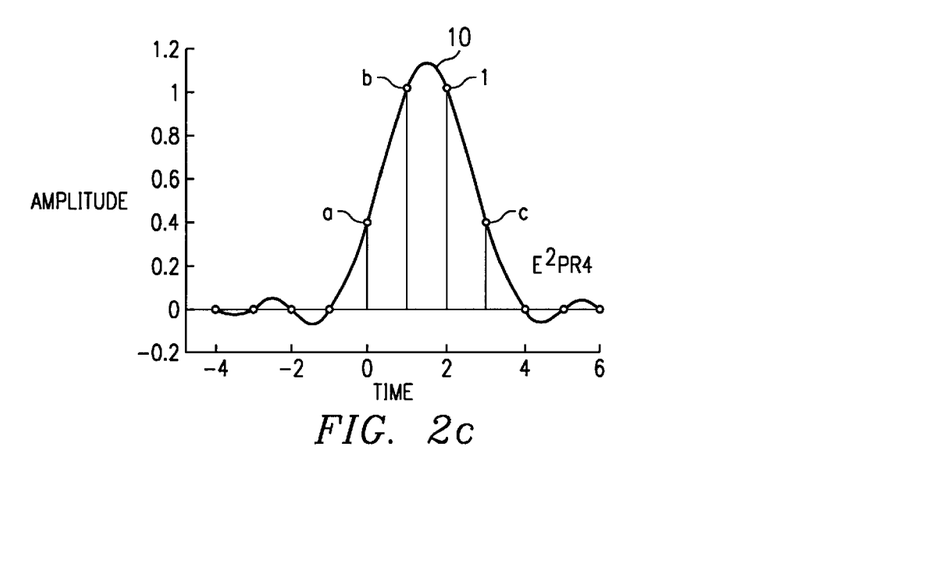

Various classes of frequency response for the signal channel prior to detection have been defined; and the class IV response appears particularly suitable for magnetic recording due to pulse shapes requiring minimal equalization. The partial response class IV channel is defined by a channel transfer function polynomial of the form $(1-D)(1+D)_N$ where N is a positive integer and D is a one period delay. FIGS. 2a–2c show the voltage pulse shapes induced by an isolated magnetization domain transition for N=1, 2, and 3; the corresponding pulses are termed PR4, EPR4, and $E^2$PR4 (or EEPR4). Thus an ideal (E)PR4 sensed voltage as a function of time consists of a sequence of overlapping (E)PR4 pulses spaced one period apart and with positive, negative, or zero amplitudes depending upon the corresponding channel bits encoded. The positive and negative amplitudes alternate corresponding to the alternation of the magnetization domain polarities. The sampling of the (E)PR4 sensed voltage yields the digital stream input to the detector, typically a sequence detector such as a maximum likelihood Viterbi decoder.

Note that the PR4 digital stream can be split into even and odd sample streams because the sampled PR4 dibit has only two nonzero values separated by one zero value (recall the 1−D response factor turns a user bit into a pair of overlapping PR4 pulses with opposite signs). In this case, the even and odd streams can be separately decoded in parallel and the runlength-limited coding thus needs a further constraint for a maximum number of 0's between successive 1's. The constraint thus takes the form of (d, G/I) where d again is the minimum number of 0's between successive 1's and G is the maximum number of 0's between successive 1's (Global constraint) plus I is the maximum number of 0's between successive 1's in each of the even and odd substreams (Interleave constraint).

Runlength-limited channel codes are block codes, and the convenience of bytewise (8 bits) treatment has led to a focus on data blocks of multiples of 8 bits. For example, a rate 8/9 (d, G/I) code maps 8-bit blocks into 9-bit blocks where the resulting bitstream of 9-bit blocks satisfies the constraint (d, G/I). The code can be described simply by listing the 256 possible 8-bit blocks and the 256 corresponding 9-bit blocks. Of course, a ROM could hold this mapping, but certain mappings may have simpler hardware implementations.

The coding efficiency of a rate 8/9 (d, G/I) code is essentially 88.9% because 8 input bits are coded by 9 output bits.

U.S. Pat. No. 5,635,933 discloses a rate 16/17 (0, 6/7) runlength-limited code which maps 16-bit input blocks into 17-bit output blocks and satisfies the constraints d=0, G=6, and I=7. Thus this code increases the coding efficiency to 94.1% and the constraint has sufficiently low G and I to permit good timing recovery. Similarly, U.S. Pat. No. 5,757,822 discloses a 16/17 (0, 7/11) code.

Rate 24/25 (d, G/l) codes further increase coding efficiency to 96%, and would be preferable provided the constraint is satisfactory. U.S. Pat. No. 5,757,294 discloses rate 24/25 (0, 14/13) and rate 24/25 (0, 11/∞) codes. However, G=14 is probably too high, and I=∞ is too high.

Further, error propagation in a runlength-limited code depends upon the range of influence input bits have on output bits. In particular, Viterbi detectors in partial response channels typically output errors most often in certain patterns such as error bit, correct bit, error bit. And if the runlength-limited code converts such an error pattern into errors spanning three or four bytes, then the errors may be uncorrectable by the error correction decoder or they may diminish the correction capability of the error correction coder on further errors. Of course, as coding efficiency increases, expected error propagation would become worse due to the large block size.

Known runlength-limited coding has problems including achievement of high code efficiency with adequate constraints plus suppression of error propagation.

SUMMARY OF THE INVENTION

The present invention provides a method of increasing the coding efficiency of runlength-limited codes while maintaining suppression of error propagation by increasing codeword length through insertion of additional uncoded bits adjacent error propagation suppression end bits of codewords. Preferred embodiment codes include a 24/25 (d=0, G=10/I=12) code generated from a 16/17 (d=0, G=6/I=8) code.

This has the advantages of increased coding efficiency with reasonable constraint levels and maintains suppressed error propagation.

BRIEF DESCRIPTION OF THE DRAWINGS

The drawings are heuristic for clarity.

DESCRIPTION OF THE PREFERRED EMBODIMENTS

System Overview

FIG. 1 schematically illustrates preferred embodiment magnetic storage and retrieval system 100 incorporating a preferred embodiment 24/25 (d=0, G=10/I=12) runlength-limited modulation (channel) encoding and decoding for writing and reading data. In particular, writing data bits to storage on magnetic disk 111 proceeds as follows. Error correction coder 101 encodes data bits into error corrected bits by an error correction encoding method such as Reed-Solomon. The error correction coding may include interleaving of blocks of bits which helps overcome bursts of error by spreading the errors over many blocks. Next, modulation coder (channel coder) 103 codes blocks of 24 bits (3 bytes) output by error correction coder 101 into blocks of 25 bits using the preferred embodiment 24/25 (0, 10/12) runlength-limited code which has suppressed error propagation. A further preceding may be included. Then the (precoded) modulation coded bits drive the read/write head to set the magnetization orientation of domains on spinning magnetic disk 111; this stores the data bits. Of course, other preferred embodiment modulation codes could be used in place of the 24/25 code in system 100.

The reading of the stored data bits first amplifies (and filters) voltages induced in the read/write head 113 due to changes in the magnetization orientation of domains on spinning disk 111. These induced voltages have the form of a sequence of overlapping pulses of shapes ideally as illustrated in FIGS. 2a–2c with positive, negative, or zero amplitudes depending upon the transitions of the domain magnetization orientations. The pulse overlaps imply intersymbol interference. Clocked analog-to-digital converter 123 samples and quantizes the sequence of pulses to form a digital output stream; there may be 64 quantization levels (a 6-bit converter). A digital filter may be used to compensate for input pulse misshape. Viterbi detector (or other sequence detector) 125 performs a maximum likelihood decoding of the digital output stream. The maximum likelihood detection corrects some errors in the digital output stream, but other errors remain uncorrected. Modulation decoder 127 is the inverse of modulation coder 103 and decodes 25-bit blocks to recovery the 24-bit blocks. Lastly, deinterleaver and error correction decoder 129 further corrects errors and recovers the data bits, hopefully with only minimal errors.

First Preferred Embodiment 24/25 Code

Figure 3:
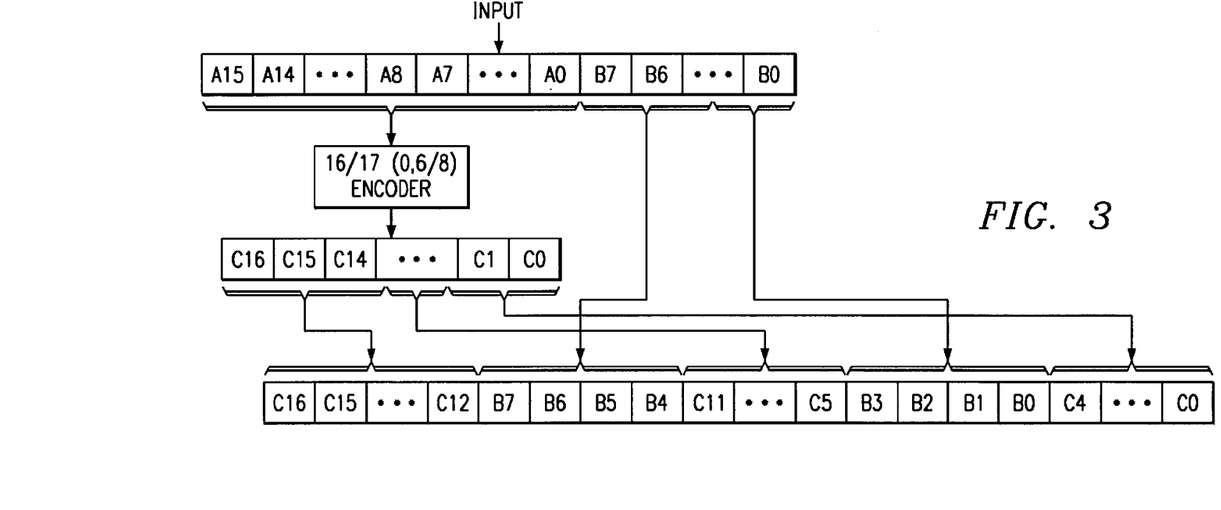
FIG. 3 indicates the bit structure of a preferred embodiment codeword.
Figure 4A:
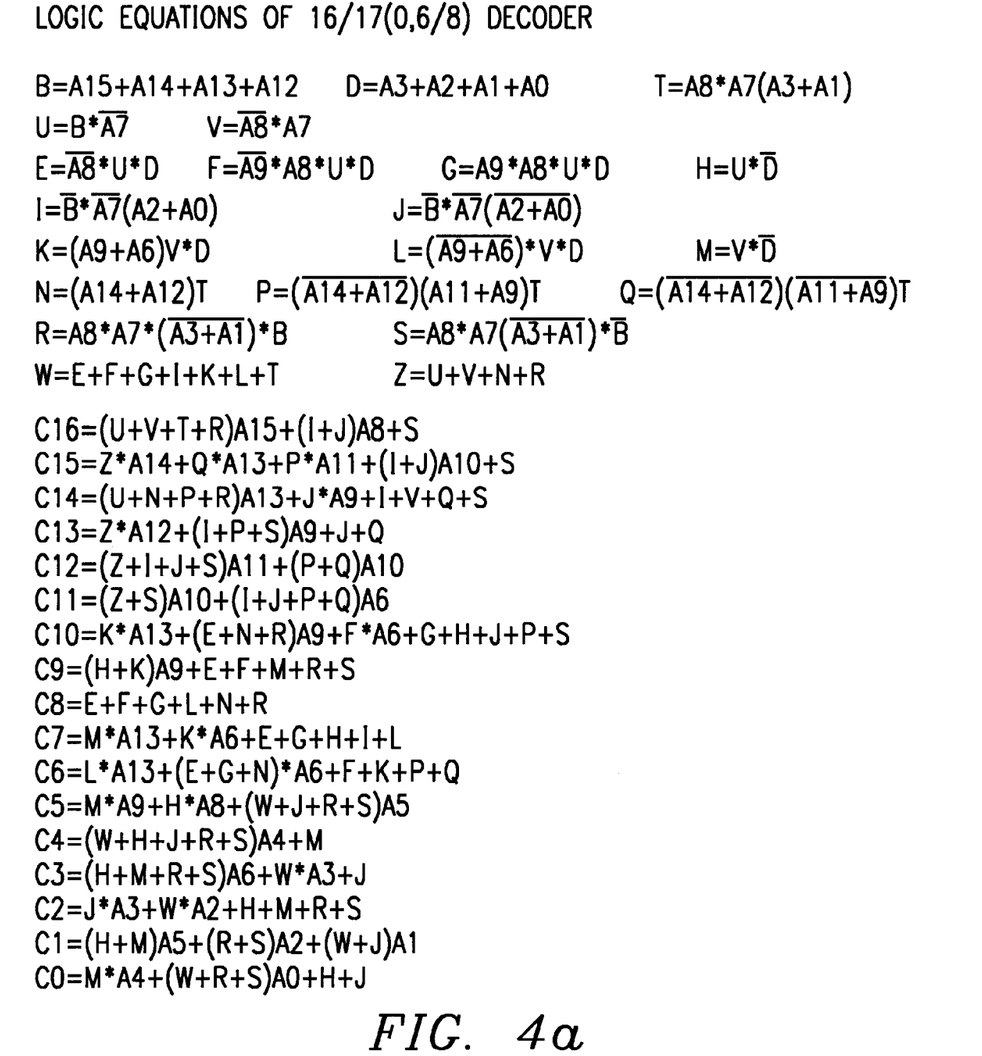
FIGS. 4a–4d show a 16/17 (0, 6/8) runlength-limited code with suppressed error propagation.
Figure 4B:
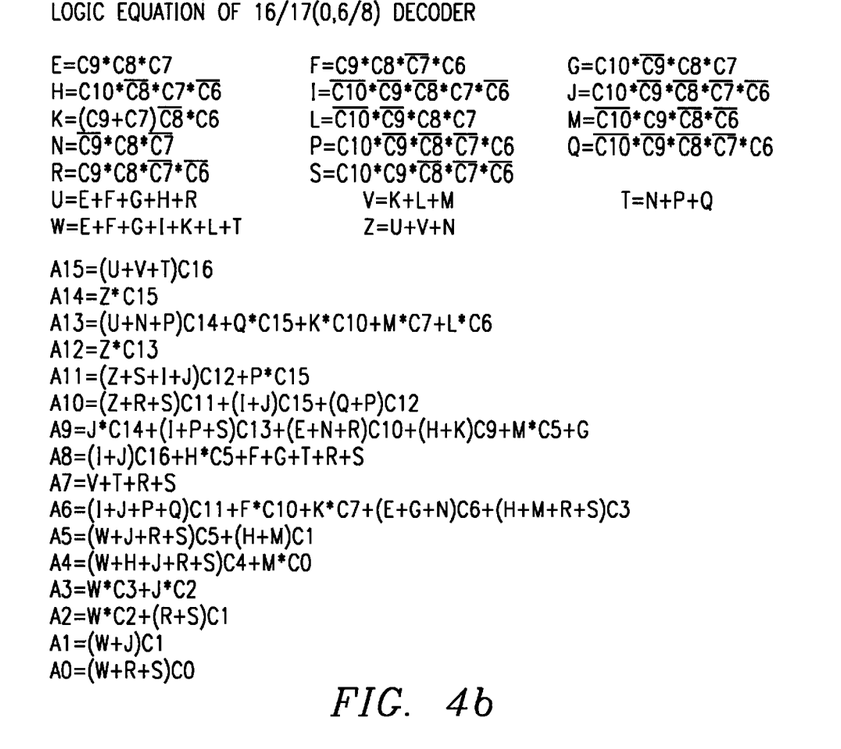

FIG. 3 shows in block form modulation coder 103 taking an input block of 24 bits (three bytes) and outputting a block (codeword) of 25 bits. In particular, presume the input block has 24 bits labelled A15 to A0 plus B7 to B0; that is, the three bytes (A15:A8), (A7:A0), and (B7:B0). First, encode the 16 bits A15 to A0 with a 16/17 (0, 6/8) runlength-limited encoder with suppressed error propagation to yield the 17 bits C16 to C0. FIGS. 4a–4b define such a 16/17 code which is more fully described in copending patent application Ser. No. 09/009,664, filed Jan. 20, 1998 and hereby incorporated by reference. The output 17-bit block satisfies the constraints G=6 and I=8 symmetrically: any sequence of bits Ck+j to Ck with length 7 has at least one 1, any end sequence of bits C16, C15, . . . Ck or Ck, . . . C1, C0 of length 4 has at least one 1, any even or odd sequence of bits Ck, Ck-2, . . . , Ck-2j of length 9 has at least one 1, and any even or odd end sequence of bits C16, C14, . . . Ck, or C15, C13, . . . Ck or Ck, . . . C2, C0 or Ck, . . . C3, C1 of length 5 contains at least one 1.

Then form the 25-bit output block by insertion of bits B7 to B4 between bits C12 and C11 plus insertion of bits B3 to B0 between bits C5 and C4. Thus the 25-bit output block (codeword) is C16, C15, C14, C13, C12, B7, B6, B5, B4, C11, C10, C9, C8, C7, C6, C5, B3, B2, B1, B0, C4, C3, C2, C1, C0.

This coding satisfies the constraint (10/12) as follows. First, consider the G=10 constraint: (1) Any interior sequence of 11 bits which includes the middle 7 bits C11, . . . C5 must include at least one 1 because the 7 bits C11, . . . , C5 include a 1 by the G=6 constraint of the 16/17 encoder. (2) Any interior sequence of 11 bits excluding any of the middle 7 bits C11, . . . , C5 will include bits from only one of the subsequences B7, B6, B5, B4 or B3, B2, B1, B0; thus at least 7 of the 11 bits form a sequence of Cs, and again the G=6 constraint of the 16/17 coder insures at least one 1. (3) Any end sequence of 6 bits (G/2+1=6) includes a subsequence of 5 end bits C16, . . . , C12 or C4, . . . , C0, and the G=6 constraint of the 16/17 coder for end sequences (any end sequence with 4 bits has at least one 1) once again insures a 1. Consequently, the 24/25 code satisfies the G=10 constraint. Indeed, for the end sequences G=6.

Similarly for the I=12 constraint: because the insertions of (B7:B4) or (B3:B0) are both insertions of 4 bits, the even or odd subsequences from the 25-bit sequences consist of even or odd subsequences of C bits with insertions of pairs of B bits. Thus a 13-bit even or odd subsequence will include two pairs of B bits plus, sometimes, a further single B-bit. Hence, a 13-bit even or odd subsequence with two pairs of B bits will include a subsequence of 9 even or odd C bits. The I=8 constraint of the 16/17 code insures that this even or odd subsequence will include a 1. The case of the 13-bit even or odd subsequence with two pairs plus a single B-bit has the form: B6,B4,C10,C8,C6,B3,B1,C4,C2,–C0,C'15,C'13,B'7 or a symmetric reflection. In this case, the I=8 constraint of the 16/17 code includes the constraint of an end sequence of 5 even or odd C bits will include a 1. Thus C8,C6,C4,C2,C0 includes a 1. Consequently, the code satisfies the constraints. The description of the suppressed error propagation follows discussion of the suppressed error propagation of the 16/17 code. 16/17 (0, 6/8) code with suppressed error propagation FIGS. 4a–4b list the defining equations for encoding and decoding an exemplary 16/17 (0, 6/8) runlength-limited code with suppressed error propagation which could be used in the preferred embodiment coder 103 and decoder 127, respectively. In FIGS. 4a–4b the 16-bit word is A15:A0 and the 17-bit codeword is C16:C0; the other symbols are intermediate values, and the overscore is the 1's complement of the bit (i.e., the complement of 1 is 0 and conversely) and arithmetic operations are modulo 2. Note that in FIG. 4b all of the defined intermediate values (E, F, ..., Z) only depend upon bits C10:C6; and so bits A15 to A8 depend only upon bits (C16:C5) and bits A7 to A0 only depend upon bits (C11:C0). In other words, the 5 end bits C16 to C12 only influence the first byte (A15:A8) and the 5 end bits C4 to C0 only influence the second byte (A7:A0).

Figure 4C:
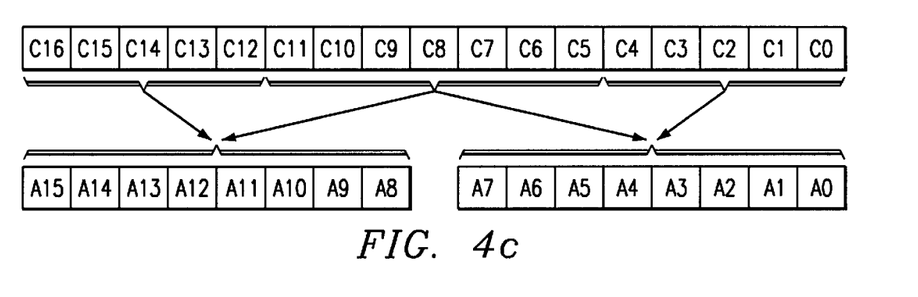

FIG. 4c illustrates this limited influence of the end C-bits on A-bits, and this suppresses error propagation in the following sense. A Viterbi detector corrects some errors by the maximum likelihood process, but it does output other errors. The error correction decoder typically operates on a bytewise basis, and if four or five successive bytes have errors, the error correction decoder may not be able to correct them or may have diminished capacity to correct other errors. Thus the propagation of errors among output bytes by a modulation decoder also becomes a measure of the quality of the runlength-limited code.

The dominant error bit patterns output by a PR4 Viterbi detector are exe and exxxe where e is an error bit and x is a correct bit. Similarly, an EPR4 Viterbi detector has dominant output error bit patterns of exe, exxxe, eexee, and eexxee. Less frequent error patterns for PR4 are exxxxxe, exxxxxxe, and exxxxxxxxe; and for the EPR4 are exxxxxe, exxxxxxe, exxxxxxxxe, eexxxee, eexxxxee, eexxxxxee, and eexxxxxxee. These error patterns propagate in the channel decoder can be analyzed as follows.

Figure 4D:
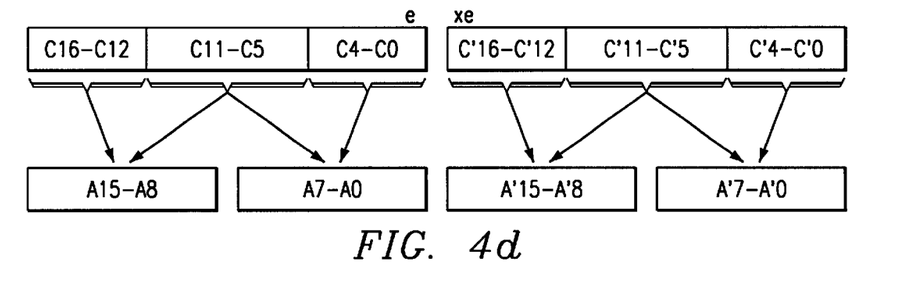

First, if an error pattern such as exe occurs within a single codeword C16:C0 and one of the e's falls in the range C11 to C5, then both output bytes A15:A8 and A7:A0 will have errors. This just means that an error pattern in a single codeword likely will affect all (two) of the bytes encoded by the codeword. However, an error pattern can straddle two codewords, and this leads to the possibility that not all (four) bytes encoded by the two codewords will contain errors. In particular, FIG. 4d illustrates two successive 17-bit codewords (C16:C0) and (C'16:C'0) input to the decoder and their influence on the four bytes (A15:A8), (A7:A0), (A'15:A'8), and (A'7:A'0) output. Thus for an exe error bit pattern with C0 of the first codeword as the first error bit and C'15 of the second codeword as the second error bit, only the second and third decoded bytes contain errors; that is, errors appear in only two bytes; namely (A7:A0) and (A'15:A'8). Similarly, for the error bit patterns of length at most 6 bits and which straddle the codeword boundary, only two output bytes will contain errors due to the error bit pattern being confined to the end 5 bits of each codeword. Hence, all of the dominant error bit patterns for PR4 and EPR4 (exe, exxxe, eexee, and eexxee) generate errors in only two output bytes if the error bit pattern straddles a boundary between codewords. Hence, this 16/17 code suppresses error propagation.

For longer error bit patterns straddling the codeword boundary, if the bit pattern has at most 11 bits, then the error bit pattern can extend past the 5 end C-bits of only one of the 17-bit codewords. This implies errors in at most three output bytes: again the second and third bytes plus either of the first or fourth bytes, depending on which codeword gets the error beyond the 5 end bits. Again, the suppresses error propagation to all four output bytes.

Error Propagation of the First Preferred Embodiment 24/25 Code

Figure 5A:
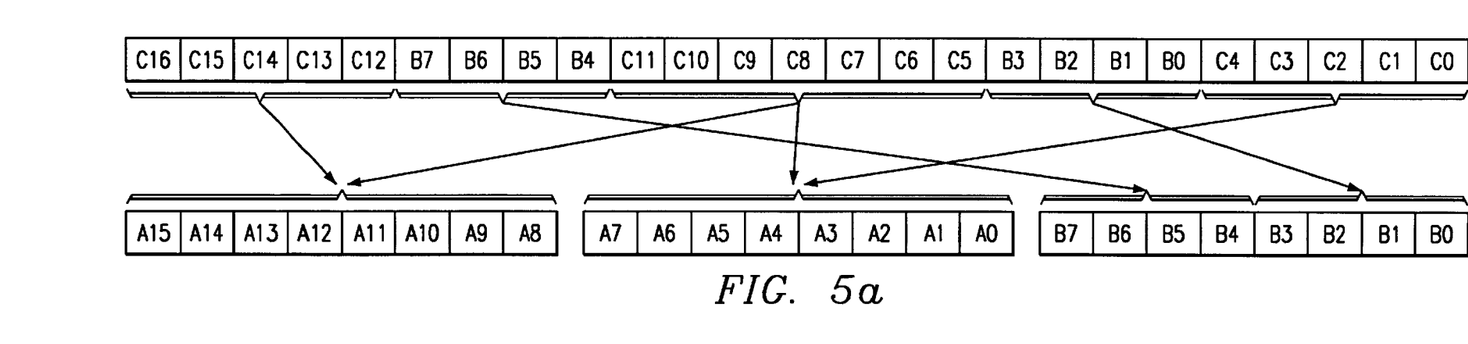
FIGS. 5a–5b illustrate error propagation.

FIG. 5a illustrates the influence of the bits of the 25-bit codeword on the bits of the three decoded bytes for the first preferred embodiment 24/25 code. Thus if an exe error bit pattern were contained in the first 5 codeword bits (C16:C12), then the error would only appear in the first output byte (A15:A8). Similarly, if the exe error bit pattern straddled the boundary C12-B7 (e.g., C12 is an error bit, B7 is correct, and B6 is the other error bit), then both the first byte (A15:A0) and the third byte (B7:B0) contain errors. However, if the exe error bit pattern straddles the B4-C11 boundary (or the C5-B3 boundary), then all three bytes (A15:A8), (A7:A0), and (B7:B0) contain errors because the middle bits C11 to C5 influence both the first and second bytes. All of the other error bit patterns can likewise straddle the B4-C11 or C5-B3 boundary and lead to errors in all three output bytes. But this would be expected for a general 24/25 code because the 25-bit codeword encodes the three bytes.

Figure 5B:
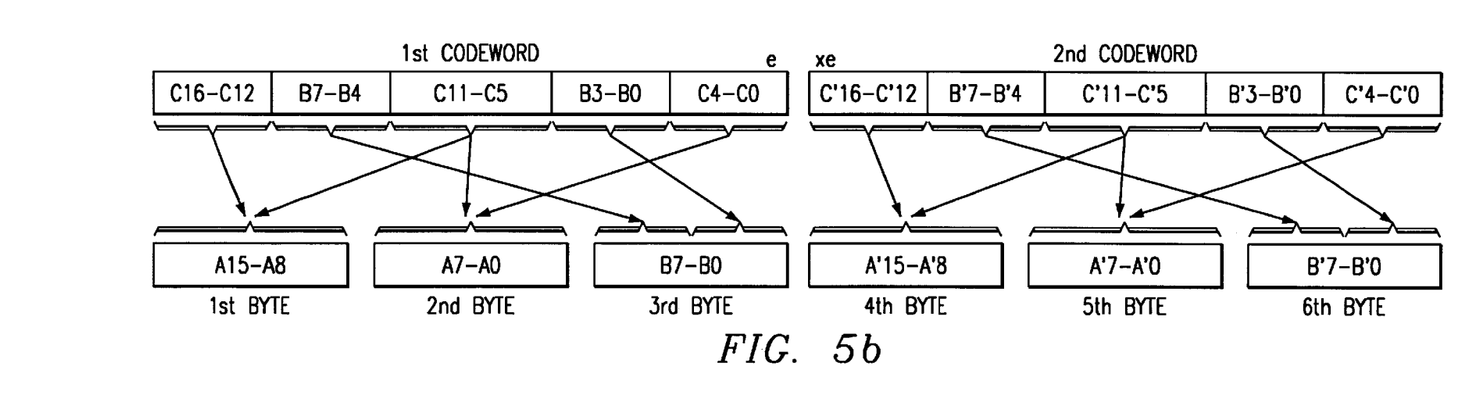

FIG. 5b illustrates the error propagation when an error bit pattern straddles the boundary of two different 25-bit codewords. In particular, an exe error bit pattern with C0 of a first codeword as the first error bit and C'15 of the second codeword as the second error bit has only the second and fourth decoded bytes (A7:A0) and (A'15:A'8) containing errors; that is, errors appear in only two bytes rather than in all six bytes encoded by the two 25-bit codewords. Similarly, for the error bit patterns of length at most 6 bits which straddle the codeword boundary, only two output bytes will contain errors due to the error bit pattern being confined to the end 5 bits of each codeword. Hence, all of the dominant error bit patterns for PR4 and EPR4 (exe, exxxe, eexee, and eexxee) generate errors in only two output bytes if the error bit pattern straddles a boundary between two 25-bit codewords.

For longer error bit patterns straddling the codeword boundary, if the bit pattern has at most 10 bits, then the error bit pattern can only extend into the 5 end C bits plus the B bits of only one of the codewords. This implies errors in at most three output bytes: again the second and fourth bytes plus one of the third or sixth bytes (the B bytes). Similarly, a error bit pattern with length at most 15 bits will only lead to errors in four (of the six) output bytes. Thus the first preferred embodiment 24/25 (0, 10/12) code suppresses error propagation.

Decoding

Preferred embodiment decoder 127 just reverses the flow of FIG. 3. In particular, presume an input 25-bit codeword (D24:D0) to be decoded into three bytes: A15:A0 plus B7:B0. Decoder 127 first sets B7=D19, B6=D18, B5=D17, B4=D16, B3=D8, B2=D7, B1=D6, and B0=D5. Then decoder 127 treats the 17 bits (D24:D20, D15:D9, D5:D0) as a 17-bit codeword (C16:C0) and decodes them as the 16 bits A15:A0 by the inverse of the 16/17 code used by encoder 103. This recovers (except for errors) the original error corrected bits.

Figure 6:
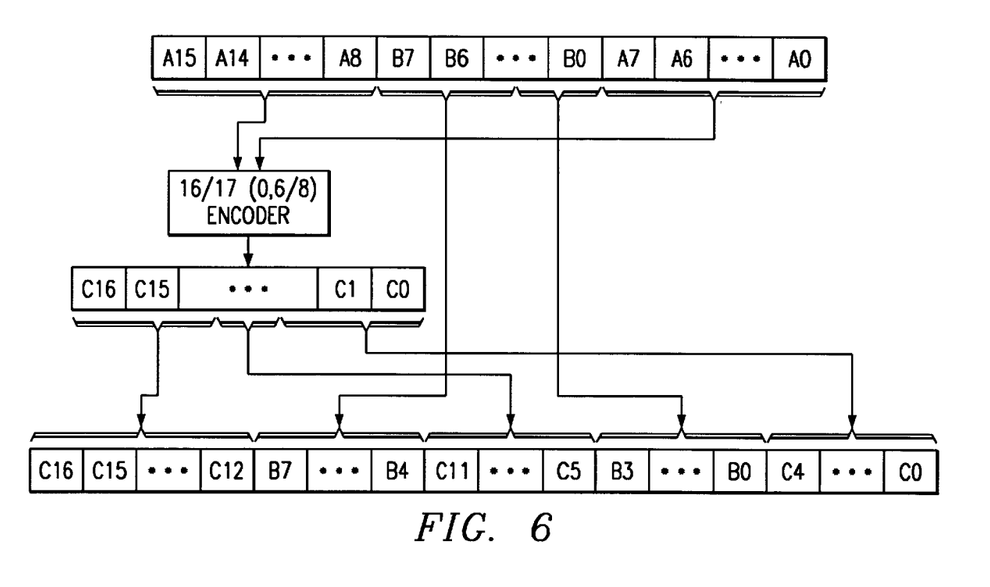
FIG. 6 shows preferred embodiment encoding.

FIG. 6 shows the first preferred embodiment 24/25 (0, 10/12) code with the three decoded bytes permuted so the middle byte consists of the 8 uncoded B-bits inserted into the 17-bit codeword to make the 25-bit codeword. This code has the same 24/25 (0, 10/12) and suppression of error propagation as the code of FIG. 3, but the code of FIG. 6 is symmetrical in that the five end bits of the 25-bit codeword influence only the two end bytes of the three bytes.

Of course, the three bytes of the code of FIG. 3 (or FIG. 6) can also be permuted so that the uncoded B byte is the first byte (lefthand end at the top of the Figures).

Preferred Embodiment N+B/N+B+j Codes

The construction of the first preferred embodiment 24/25 code from a 16/17 code with retention of suppression of error propagation can be extended to insertion of B uncoded bits into an N/N+j codeword to form a N+B/N+B+j code which retains suppression of error propagation. The construction creates a N+B+j codeword by insertion of B/2 uncoded bits between the error suppressing end bits and the remainder of the N+j bit codeword at each end.

Figure 7A:
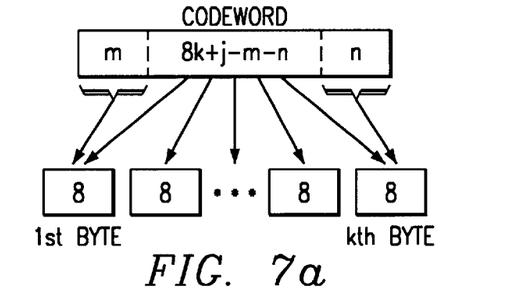
FIGS. 7a–7c illustrate preferred embodiment methods.
Figure 7B:
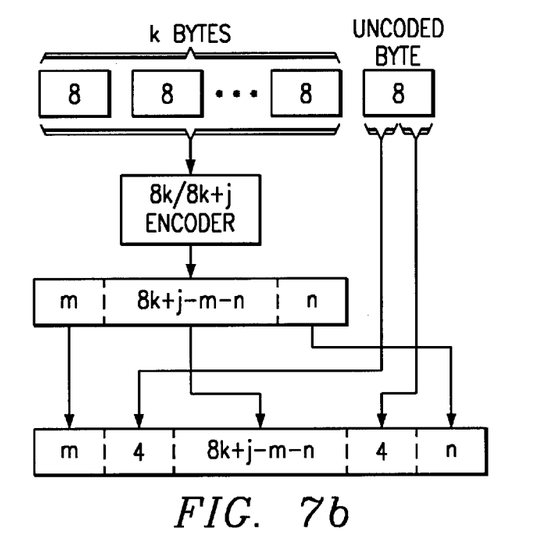

For example, presume N is a multiple of 8 (i.e., N=8k) and presume a starting 8k/8k+j (0,G/I) code in which the first m bits of the 8k+j bit codeword only influence the first byte (of the k decoded bytes) and the last n bits only influence the last (kth) byte as illustrated in FIG. 7a. The middle 8k+j−m−n bits may influence all k bytes. Then presume B equals 8 (i.e., one uncoded byte is added) and form the 8k+8/8k+8+j code by insertion of the 8 uncoded bits into the 8k+j codeword with 4 uncoded bits placed between the first m bits and the remainder of the codeword and with the other 4 uncoded bits placed between the n last bits and the remainder of the codeword. FIG. 7b is analogous to FIG. 3 and shows the k+1 bytes coded as a 8k+8+j bit codeword; that is, a 8k+8/8k+8+j code.

This 8k+8/8k+8+j code has constraints (0,G+4/I+4) if G is at most the minimum of m+n and 8k+j−m−n, and if I is at most (8k+j)/2. For example, the first preferred embodiment 24/25 code derived from the 16/17 (0, 6/8) code, and for this case k=2 (N=16), G=6, I=8, j=1, and m=n=5. Thus m+n=10 and 8k+j−m−n=7, so G is less than both; and (8k+j)/2=17/2 is greater than 1. Consequently, the code is 24/25 (0, 10/12).

Similarly, adding an uncoded byte as two 4-bit insertions in a 24/25 (0,G/I) codeword with the m and n end bits of the codeword only influencing the first and third decoded bytes creates a 32/33 (0,G+4/I+4) code if G is at most the minimum of m+n and 25−m−n and if I is at most 25/2. Again the insertions of 4 bits would be between the first m bits and the remainder of the 25-bit codeword and between the last n bits and the remainder of the codeword. This retains the suppression of error propagation. Likewise, a 40/41 code can be constructed from a 32/33 code, and so forth.

Figure 7C:
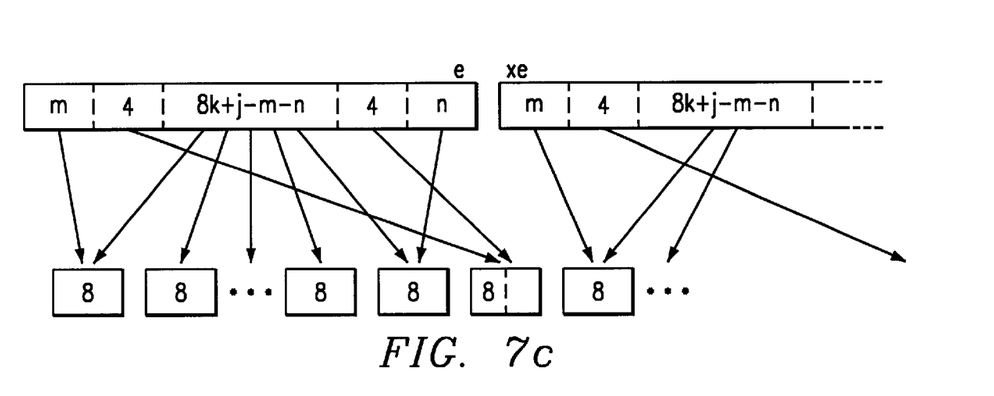

FIG. 7c illustrates error propagation in these 8k+8/8k+8+j codes constructed from 8k/8k+j codes with m and n end bits only influencing the first and last (kth byte). In particular, if an error bit pattern straddles the boundary between two 8k+8+j codewords and has length of at most the minimum of n+1 and m+1, then only the 2 bytes influenced by the m and n bit end regions will have errors. (Of course, an error bit pattern in the codeword interior can lead to errors in all k+1 bytes). Similarly, an error bit pattern straddling two codewords and of length at most the minimum of m+5 and n+5 will lead to errors in only three bytes: the two bytes influenced by the m and n end bits plus the inserted uncoded byte. For error bit patterns of length m+6 or n+6, the errors can appear in k+2 bytes: all k+1 bytes of a first codeword (an error bit in the interior 8k+j−m−n bits and in the added uncoded 4 bits) plus the one byte influenced by the end bit of the adjacent second codeword. Lastly, an error bit pattern of length m+n+2 can influence 4 bytes by covering the m and n end bits plus one bit of each of the abutting inserted groups of 4 bits; however, this may be moot in that m+6 or n+6 will often be at most m+n+2.

Parity Bit Addition

Figure 8:
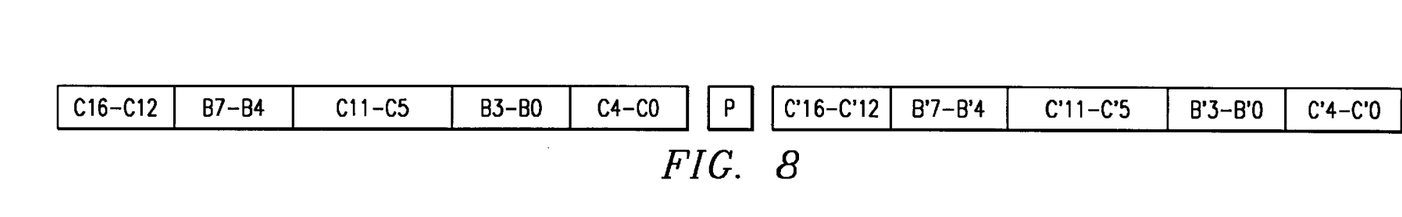
FIG. 8 shows a preferred embodiment codeword with parity.

The preferred embodiment 24/25 (0, 10/12) code can have a parity bit added to pairs of codewords to form a 48/51 (0, 10/13) code with continued suppression of error propagation. FIG. 8 illustrates a 51-bit codeword made from two 25-bit codewords of the 24/25 preferred embodiment plus an intervening parity labeled P. Note that the parity bit does not increase G to 11 because G is really only equal to 6 at the ends of the 25-bit codewords as previously described. The parity bit can be used to eliminate the most common errors, namely exe for PR4 and EPR4 channels, after the Viterbi detection. The coding efficiency of the 48/51 code is 94.1%.

The insertion of a parity bit in pairs of codewords to create a new code retaining suppression of error propagation can be applied to the other preferred embodiment codes.

Modifications

The preferred embodiments can be modified in various ways while retaining the feature of an increased coding efficiency runlength-limited code with suppression of error propagation and reasonable constraints.

For example, the uncoded B-bits inserted into the C-bit codewords could first be remapped analogous to the method of U.S. Pat. No. 5,784,010.

Further, the bits (B7:B4) could be moved from insertion between C12–C11 to between C13–C12 while retaining the insertion of bits (B3:B0) between C5–C4; or symmetrically, move (B3:B0) to between C4–C3 and retain (B7:B4) between C12–C11. This will slightly decrease suppression of error propagation for error bit patterns of length equal to 6 because three bytes rather than two will be affected. (However, interior bits of the codewords already have errors to all three decoded bytes of the codeword, so no real decrease in error suppression occurs.) Further, the G=10 constraint on interior sequences only requires at least 7 C bits between the two sets of four B bits to take advantage of the G=6 of the 16/17 code. Similarly, end sequences with at least four C bits take advantage of the G=6 of the 16/17 code.

Also, a split of the B-bits into four pairs of bits also works provided enough C-bits separate the pairs; but again this will slightly decrease suppression of error propagation if the B-bits get closer to the codeword ends. (Again, errors in three bytes occur for shorter error bit patterns). For example, codewords with 5 C-bits separating central pairs of B-bits and 3 C-bits separating outside pairs of B-bits with 3 end C-bits such as C16–C14,B7–B6,C13–C11,B5–B4,C10–C6, B3–B2,C5–C3,B1–B0,C2–C0 will satisfy G=10 because any subsequence of 11 bits will include 7 C bits; and error bit patterns straddling two codewords and of length at most 4 will lead to error in at most two bytes (the two end-bit influenced bytes) and patterns of length at most 7 lead to errors in at most three bytes (the two end-bit influenced bytes plus an uncoded B byte). Likewise, 5 central C-bits with 2 C-bits separating B-bit pairs and 4 end C-bits works to limit errors to two bytes if they straddle two codewords and have length at most 5 bits. Also, an asymmetric codeword such as 4 central C-bits, 3 or 4 C-bits separating B-bit pairs, and 3 end C-bits. Indeed, with the B-bits in separated pairs the number of end C-bits can be decreased, such as 7 central C-bits, 3 C-bits separating B-bit pairs, and 2 end C-bits.

Similarly, the inserted bits can be moved about a little near the codeword ends for higher order codes such as 32/33 and 40/41, or parity bit added codes such as 48/51.

What is claimed is:

1. A method of runlength-limited coding blocks of N+B bits (N and B positive integers), comprising the steps of:

(a) runlength-limited coding N bits to form a codeword of N+j bits where N and j are positive integers, said codeword characterized by (i) the first m bits (m a positive integer) decode into only the first K bits of said N bits and (ii) the last n bits (n a positive integer) decode into only the last K bits of said N bits; and (b) forming a second codeword of N+B+j bits (B a positive integer) by taking the first m bits to be the same as the first m bits of said N+j bit codeword, the next b bits (b a positive integer less than B) to be independent of said N+j codeword, the next N+j−m−n bits to be the same as bits m+1 through N+j−m of said N+j codeword, the next B−b bits to be independent of said N+j codeword, and the last n bits to be the same as the last n bits of said N+j codeword.

2. The method of claim 1, wherein:

(a) N=16, j=1, m=n=5, b=4, and B=8.

* * * * *